United States Patent
Mangano et al.

(10) Patent No.: US 11,705,904 B2
(45) Date of Patent: Jul. 18, 2023

(54) SYSTEM AND METHOD FOR SELECTING AN OPERATING MODE, SUCH AS A BOOT MODE, OF A MICRO-CONTROLLER UNIT

(71) Applicant: STMicroelectronics S.r.l., Agrate Brianza (IT)

(72) Inventors: Daniele Mangano, San Gregorio di Catania (IT); Alessandro Inglese, San Pietro Clarenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/671,844

(22) Filed: Feb. 15, 2022

(65) Prior Publication Data
US 2022/0263509 A1  Aug. 18, 2022

(30) Foreign Application Priority Data
Feb. 16, 2021  (IT) .................. 102021000003542

(51) Int. Cl.
*H03K 19/0175* (2006.01)
*G06F 13/12* (2006.01)

(52) U.S. Cl.
CPC ... *H03K 19/017581* (2013.01); *G06F 13/124* (2013.01)

(58) Field of Classification Search
CPC ............. H03K 19/01; H03K 19/017; H03K 19/01721; H03K 19/0175; H03K 19/017581; H03K 19/09429; G06F 13/10; G06F 13/102; G06F 13/105; G06F 13/12; G06F 13/124; G06F 13/126
See application file for complete search history.

(56) References Cited

U.S. PATENT DOCUMENTS 8,681,571 B2 *  3/2014  Fox ............... G11C 29/022
                                                 365/189.11
9,299,440 B2 *  3/2016  Grunzke ........ H03K 19/018571
(Continued)

FOREIGN PATENT DOCUMENTS

| EP | 0582392 A1 | 2/1994 |
| EP | 3055777 A1 | 4/2015 |
| WO | 2020036481 A1 | 2/2020 |

OTHER PUBLICATIONS

IT Search Report and Written Opinion for priority application, IT Appl. No. 102021000003542, report dated Jul. 27, 2021, 9 pages.

*Primary Examiner* — Jason Crawford
(74) *Attorney, Agent, or Firm* — Crowe & Dunlevy

(57) ABSTRACT

A microcontroller includes an input pin and internal pull-up and pull-down circuits. External pull-up and pull-down circuits are also coupled to the input pin. The microcontroller is operable according to different configuration modes which include configuring the input pin in a floating state. A control logic then configures the internal pull-up and pull-down circuits according to an internal pull-up mode to acquire a first input voltage signal (at a first logic value) from the input pin, and further configure the internal pull-up and pull-down circuits according to an internal pull-down mode to acquire a second input voltage signal (at a second logic value) from the input pin. A selection of the operating mode of the MCU is then made based on the acquired first and second logic values.

22 Claims, 5 Drawing Sheets

(56) References Cited

U.S. PATENT DOCUMENTS

| | | | | |
|---|---|---|---|---|
| 2008/0007289 A1* | 1/2008 | Kimura | ............... | H04L 25/0278 |
| | | | | 326/30 |
| 2010/0188917 A1* | 7/2010 | Fox | ........................ | G11C 29/02 |
| | | | | 711/E12.001 |
| 2011/0316581 A1* | 12/2011 | Ichikawa | ......... | H03K 19/00384 |
| | | | | 326/30 |
| 2015/0145560 A1* | 5/2015 | Ghosh | ................ | H03K 19/0002 |
| | | | | 326/56 |
| 2015/0280692 A1* | 10/2015 | Jung | .............. | H03K 19/018585 |
| | | | | 327/109 |
| 2017/0147367 A1 | 5/2017 | Alley et al. | | |
| 2017/0294909 A1* | 10/2017 | Bartling | ................ | G11C 5/148 |
| 2019/0041452 A1* | 2/2019 | Chang | ............ | H03K 19/017581 |
| 2021/0367599 A1* | 11/2021 | Sung | ................ | H03K 19/09421 |
| 2022/0263509 A1* | 8/2022 | Mangano | ................... | G06F 1/26 |
| 2022/0308645 A1* | 9/2022 | Colombo | .................. | G06F 1/24 |

* cited by examiner

SYSTEM AND METHOD FOR SELECTING AN OPERATING MODE, SUCH AS A BOOT MODE, OF A MICRO-CONTROLLER UNIT

PRIORITY CLAIM

This application claims the priority benefit of Italian Application for Patent No. 102021000003542, filed on Feb. 16, 2021, the content of which is hereby incorporated by reference in its entirety to the maximum extent allowable by law.

TECHNICAL FIELD

Embodiments herein relate to a system and a method for selecting an operating mode, in particular a boot mode, of a micro-controller unit.

BACKGROUND

Applications that use microcontrollers are rapidly growing as cost of production decreases and performance of embedded systems increases. The need to provide flexibility in terms of data input and output is a necessity to create adaptability in microprocessor communication. The use of General Purpose Input/Outputs (GPIOs) allows an open ended transmission between devices on an embedded level.

A GPIO is known to be an interface available on most microcontrollers (MCU). Generally, there are multiple GPIO pins (as well as other types of pins, such as reset pins) on a single MCU for multiple, simultaneous, interactions of applications. The pins can be programmed as input, so that data from external sources can be fed into the MCU. Output operations can also be performed on GPIO pins, so that formatted data can be transmitted to outside devices/peripheries, thus providing a simple mechanism to program and retransmit data through the same port interface.

However, small and integrated packages usually make available a limited number of GPIOs, which is often dictated by business considerations. As GPIO pins impose several constraints in small packages (such as space occupation, costs, etc.), it is important to minimize their number.

In some implementations, MCUs offer to the final user the possibility of selecting the specific boot mode to be accessed at power-on/reset of the device that incorporates the MCU. Some user boot options are managed through input pins or boot pins made available as GPIOs. Boot modes allow the user to perform several actions. Few and non-limiting examples are: forcing the CPU to start fetching from one of the device embedded memories or interfaces; putting the device in the configuration needed to download user software in one of the device embedded memories or in an external memory connected to the device; and selecting specific device setup to ensure inter-operability with the rest of the system at start-up.

In general, N input (or boot) pins allows selection among $2^N$ input commands. To increase the number of selectable commands, especially for increasing the boot options that can be chosen through one single pin, the known solution is to increase the number of pins, which contradicts the above-mentioned requirement of minimizing the input pin number.

There is a need in the art to provide a system and a method for selecting an operating mode of a micro-controller unit, to overcome the problems previously illustrated.

SUMMARY

In an embodiment, a system is provided for selecting an operating mode of a micro-controller unit.

In an embodiment, a method is provided for selecting an operating mode of a micro-controller unit.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION

Figure 1A:
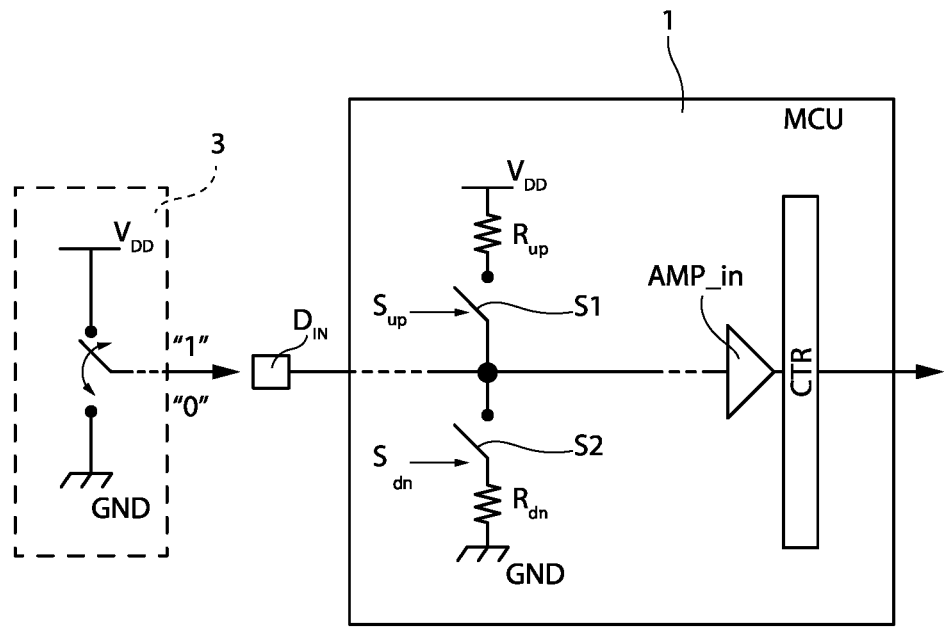
FIG. 1A is a schematic representation of a microcontroller (MCU) coupled to external pull-up and pull-down circuits.

FIG. 1A schematically shows a structure of a microcontroller (MCU) 1, including an input pin (boot pin) $D_{IN}$ that can be made available as a GPIO pin once the boot is completed. The structure shown in FIG. 1A is limited to the elements/features useful for understanding the present disclosure.

The input pin $D_{IN}$ can be configured as a digital (e.g., binary) input, receiving external digital values "1" (e.g., $V_{DD}$) or "0" (e.g., ground voltage GND, or 0V). Selection of external digital values can be made through one or more selectors or switches. FIG. 1A identifies with reference numeral 3 an external circuitry including a switch $S_{ext}$ that can be controlled in three positions: coupled to $V_{DD}$ terminal to provide a logic "1" signal; coupled to GND or 0V terminal to provide a logic "0" signal; and left floating (i.e., an intermediate state wherein none of $V_{DD}$ and GND/0V is provided at input pin $D_{IN}$). The floating condition is an undesired and uncontrolled state (e.g., the signal provided to the input pin $D_{IN}$ is noise).

Internal pull-up and a pull-down resistors $R_{up}$, $R_{dn}$ are electrically coupled to the input pin $D_{IN}$. The values of the pull-down and pull-up resistors $R_{up}$, Ran may vary from chip-to-chip and pin-to-pin and are typically of tens of kΩ each (in the range of 20-50kΩ). Switches S1 and S2 are closed if either signal $S_{up}$ or $S_{dn}$ is specified, connecting the corresponding resistor $R_{up}$, $R_{dn}$ to the input pin $D_{IN}$.

An input amplifier, or input buffer, AMP_in is optionally present, to restore correct digital levels.

An output amplifier, or output buffer, AMP_out is also optionally present, but it is irrelevant to the present disclosure and therefore not further discussed nor shown in FIG. 1A.

A control logic CTR is configured to control (activate) the input amplifier AMP_in and the output amplifier AMP_out, in a per se known manner. The control logic CTR is further configured to activate the internal pull-up configuration by generating the signals $S_{up}$ and San that close the switch S1 and open the switch S2, respectively, and to activate the internal pull-down configuration by generating the signals $S_{up}$ and $S_{dn}$ that open the switch S1 and close the switch S2, respectively.

The control logic CTR also receives at input the output signal from the input amplifier AMP_in, which is the logic value selected according to the external or internal pull-up/pull-down configurations.

Figure 1B:
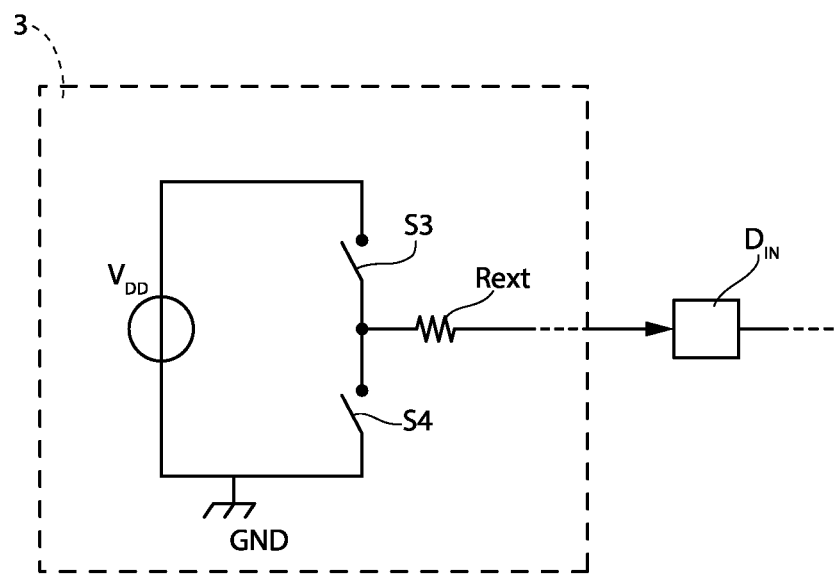
FIG. 1B is a more detailed representation of the external pull-up and pull-down circuits.

As shown in FIG. 1B, the input pin $D_{IN}$ of the MCU 1 can be coupled to an external resistor $R_{ext}$, through which the digital values "1" ($V_{DD}$) and "0" (GND or 0V) are supplied to the internal resistors $R_{up}$, $R_{dn}$. External resistor $R_{ext}$ has a resistance value that is smaller than the resistance values of the internal resistors $R_{up}$, $R_{dn}$ (e.g., at least 1 order of magnitude smaller). The external resistor $R_{ext}$ is connected to the $V_{DD}$ voltage through a first external switch S3 and to the GND or 0V through a second external switch S4. The configuration shown in FIG. 1B is a mere example and other circuit arrangement can be implemented.

In the input mode configuration, such as when the MCU 1 is configured as an input stage, the connection of the input pin $D_{IN}$ to $V_{DD}$ or GND through resistor $R_{ext}$ allows the selection of two input options (an external pull-up and an external pull-down). Since the internal pull-up and pull-down configurations cannot be directly controlled by the user, the external pull-up and pull-down options can be used in order to set the voltage level to "1" or "0" (and then make it change only when desired by the user). It is noted that, typically, internal pull-up and pull-down configurations cannot be directly or actively controlled or set by the user during the boot mode (the user can set the internal pull-up and pull-down configurations via software once the boot is completed and/or the pin is configured in the GPIO mode).

The external resistor $R_{ext}$ is said to be "strong" (opposite to the "weak" internal resistors $R_{up}$, $R_{dn}$) in that it has a resistance value higher than the resistance values of the internal resistors $R_{up}$, $R_{dn}$. Therefore, when the input pin $D_{IN}$ is supplied through the external circuitry shown in FIG. 1B, the high ("1") voltage level is forced by closing switch S3 and opening switch S4; the low ("0") voltage level is forced by closing switch S4 and opening switch S3; the floating state correspond to both switches S3 and S4 being open. High and low voltage levels are forced irrespective of the configuration of the internal pull-up and pull-down circuitry of the MCU 1.

As apparent from the above discussion, use of a single input pin $D_{IN}$ allows two external input commands to be provided to the MCU 1, while the use of two input pins $D_{IN}$ allows four input commands to be provided to the MCU 1.

In order to increase the number of commands or boot options that can be externally chosen by the user of the MCU, such as the MCU 1 of FIG. 1A, without increasing the number of input pins (i.e., boot pins, or GPIO pins) $D_{IN}$, embodiments herein foresee the use of a third input mode configuration, namely a floating input.

Figure 2A:
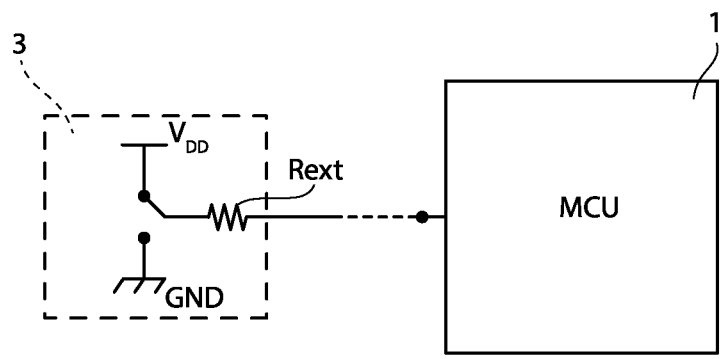
FIGS. 2A-2C shows respective operating configuration modes of the external pull-up and pull-down circuits.
Figure 2B:
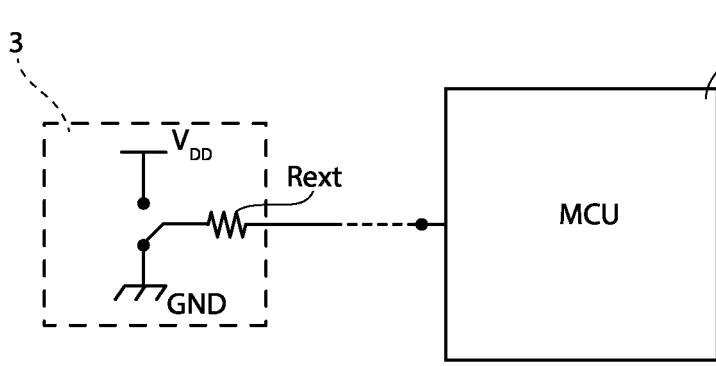
Figure 2C:
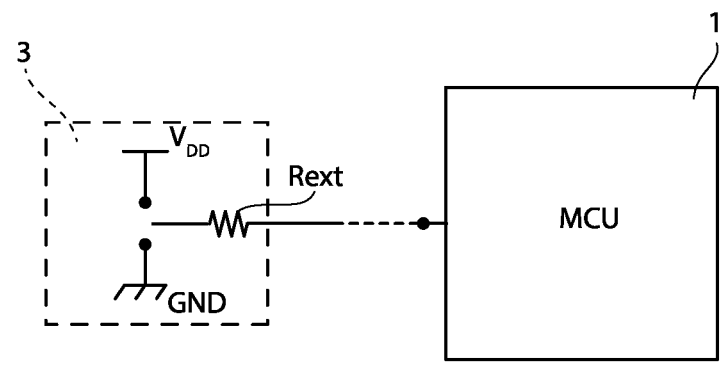

FIGS. 2A-2C (in which elements common to those of FIG. 1A are indicated with the same reference numerals) show three respective input mode configurations, that can be selected by the user:

Input with external pull-up (FIG. 2A): external pull-up resistor is used to ensure a well-defined (or pre-defined) logic level (e.g. a logic or binary signal, such as logic level "1").

Input with external pull-down (FIG. 2B): external pull-down resistor is used to ensure a different well-defined (or pre-defined) logic level (e.g. a logic or binary signal, such as logic level "0").

Floating input (FIG. 2C): no well-defined (or pre-defined) external signal is provided, and input logic levels are determined by the internal pull-up and pull-down configurations (i.e., by connecting the input amplifier AMP_in to $V_{DD}$ through the pull-up resistor $R_{up}$ or to GND/0V through the pull-down resistor $R_{dn}$). Internal pull-up and pull-down resistors are used to ensure a well-defined input logic level (e.g. a binary signal, "0" or "1" according to the respective internal pull-down or pull-up configuration implemented).

The external pull-up configuration (FIG. 2A) is obtained by connecting the external resistor $R_{ext}$ to $V_{DD}$—with reference to FIG. 1B, by closing (turning on) the first external switch S3 and opening (turning off) the second external switch S4.

The external pull-down configuration (FIG. 2B) is obtained by connecting the external resistor $R_{ext}$ to GND/0V by closing (turning on) the second external switch S4 and opening (turning off) the first external switch S3.

The floating input configuration (FIG. 2C) is obtained by leaving the first and second switches S3 and S4 open (turned off).

Figure 3:
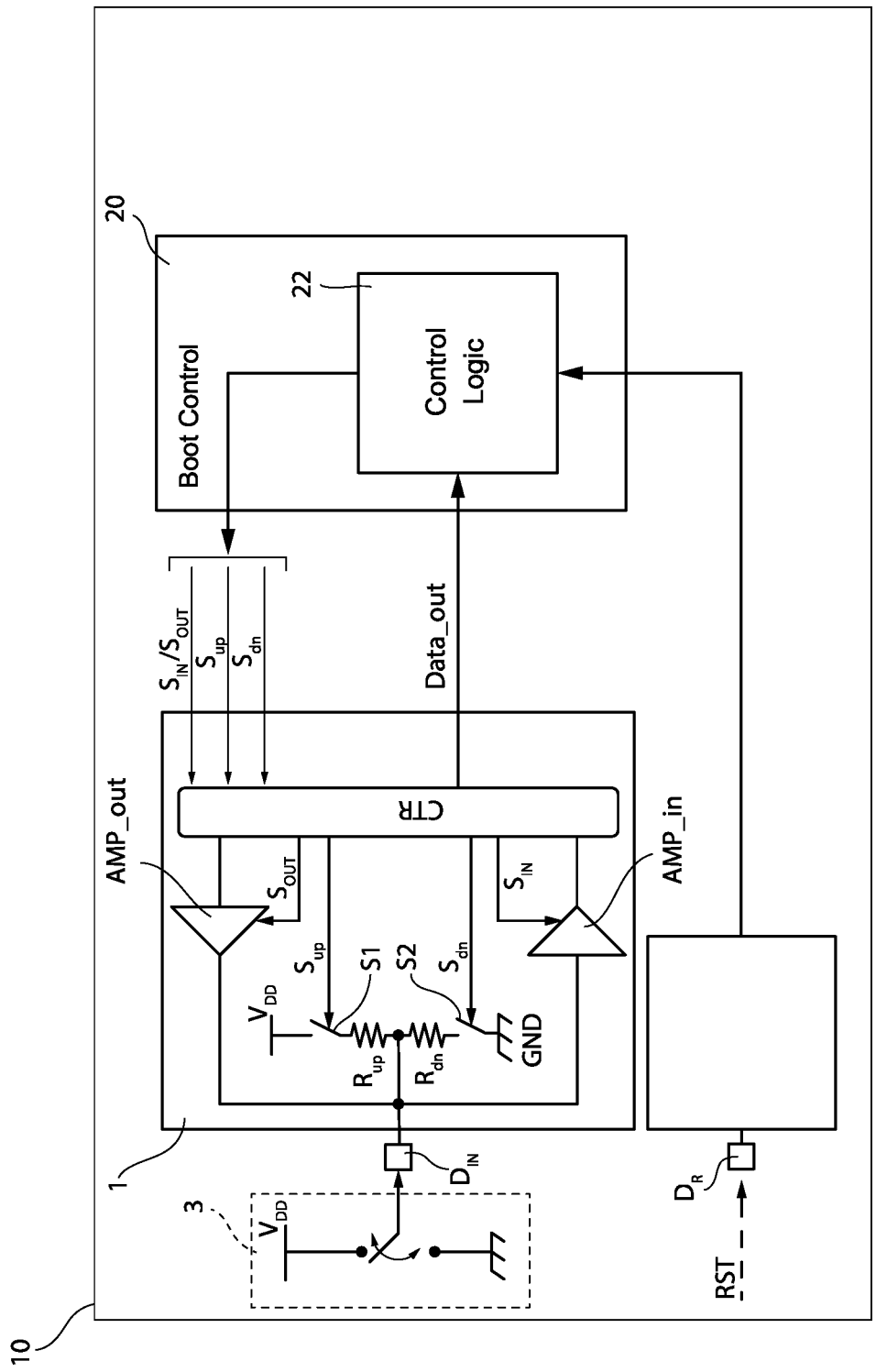
FIG. 3 shows a system including a MCU, such as the MCU of FIG. 1A, coupled to a controller.

FIG. 3 shows a system 10 including the MCU 1 of FIG. 1A and a controller 20, in particular a boot controller 20, which includes a control logic 22 (e.g., comprising a microprocessor and a memory, not shown).

The boot controller 20 can be either internal to the MCU 1 (i.e., it is part of the MCU 1) or external to the MCU 1, and is operatively coupled to the control logic CTR of the MCU 1 to send control signals $S_{up}$, $S_{dn}$, $S_{IN}$, $S_{OUT}$. The signal $S_{up}$ controls the implementation, by the control logic CTR, of the internal pull-up configuration (turning on switch S1 and turning off switch S2); the signal $S_{dn}$ controls the implementation, by the control logic CTR, of the internal pull-down configuration (turning on switch S2 and turning off switch S1); the signal $S_{IN}$ controls the implementation, by the control logic CTR, of the input mode configuration (activation of input amplifier AMP_in); and the signal $S_{OUT}$ controls the implementation, by the control logic CTR, of the output mode configuration (activation of output amplifier AMP_out). In particular, in the context of the embodiments herein, the MCU 1 is used with the input configuration only (i.e., input amplifier AMP_in is turned on by signal $S_{IN}$ and output amplifier AMP_out is turned off, or otherwise deactivated, by signal $S_{OUT}$).

In the context of the embodiments herein, the control signals $S_{up}$, $S_{dn}$, $S_{IN}$, $S_{OUT}$ are generated as a consequence of a specific command (in the following, a "reset" command RST) generated or otherwise provided by the user, and acquired by the MCU 1 through a reset pin $D_R$ that may be part of the MCU 1 or external to the MCU 1. After having generated the reset command RST, the user selects or forces one among the external pull-up (FIG. 2A), external pull-down (FIG. 2B) or external floating (FIG. 2C) configuration (as previously described). Each of such configurations corresponds to a boot option that the user desires to implement.

In one operative condition, the user provides the reset command RST and forces the external pull-up configuration, setting an input signal "1" at input pin $D_{IN}$. The boot controller 20 automatically controls an internal pull-up configuration (which would correspond to an input signal "1"). As said, irrespective of the internal pull-up or pull-down configuration, the logic signal read by the input amplifier AMP_in is the high, or "1", logic signal set by the external pull-up configuration.

The output generated by the input amplifier AMP_in is provided to the control logic CTR, which in turn provides a corresponding signal Data_out to the control logic 22 of the boot controller 20. Then, the boot controller 20 controls an internal pull-down configuration of the MCU 1 (which would correspond to an input signal "0"), with the external pull-up configuration still active. However, as already discussed, the external pull-up prevails over the internal pull-down, so that the logic signal read by the input amplifier AMP_in is the high, or "1", logic signal set by the external pull-up configuration, irrespective of the internal pull-down configuration. The output generated by the input amplifier AMP_in is provided to the control logic CTR, which in turn provides a corresponding signal Data_out to the control logic 22 of the boot controller 20. The boot controller 20 identifies the external pull-up configuration set by the user based on the logic values received, which are "1" and "1" respectively.

In another possible operative condition, the user provides the reset command RST and forces an external pull-down configuration, setting an input signal "0". The boot controller 20 automatically controls the internal pull-up configuration (which would correspond to an input signal "1"). However, as previously discussed, the external pull-down prevails over the internal pull-up, and the logic signal read by the input amplifier AMP_in is the low, or "0", logic signal set by the external pull-down configuration, irrespective of the internal pull-up configuration. The output generated by the input amplifier AMP_in is provided to the control logic CTR, which in turn provides a corresponding signal Data_out to the control logic 22 of the boot controller 20. Then, the boot controller 20 controls an internal pull-down configuration (which would correspond to an input signal "0"), with external pull-down configuration forced by the user still active. As said, the logic signal read by the input amplifier AMP_in is also in this case the low, or "0", logic signal. The output generated by the input amplifier AMP_in is provided to the control logic CTR, which in turn provides a corresponding signal Data_out to the control logic 22 of the boot controller 20. The boot controller 20 identifies the external pull-down configuration set by the user based on the logic values received, which are "0" and "0" respectively.

In a further possible operative condition, the user provides the reset command RST through the reset pin $D_R$ and leaves the input pin $D_{IN}$ floating. The boot controller 20 automatically controls an internal pull-up configuration (which corresponds to an input signal "1"). In this case, the internal pull-up determines the logic value "1" read by the input amplifier AMP_in. The output generated by the input amplifier AMP_in is provided to the control logic CTR, which in turn provides a corresponding signal Data_out to the boot controller 20. Then, and with the input pin $D_{IN}$ still left floating, the boot controller 20 controls an internal pull-down configuration (which corresponds to an input signal "0"). In this case, the internal pull-down determines the logic value "0" read by the input amplifier AMP_in. The output generated by the input amplifier AMP_in is provided to the control logic CTR, which in turn provides a corresponding signal Data_out to the control logic 22 of the boot controller 20. The boot controller 20 identifies that, in both configurations, the signals received by the control logic CTR correspond to the expected signals, according to the internal pull-up/pull-down configurations previously set by the boot controller 20 itself. In fact, in this case, the boot controller 20 identifies the floating configuration set by the user based on the logic values received during and after $T_R$, which are "1" and "0" respectively.

Figure 4:
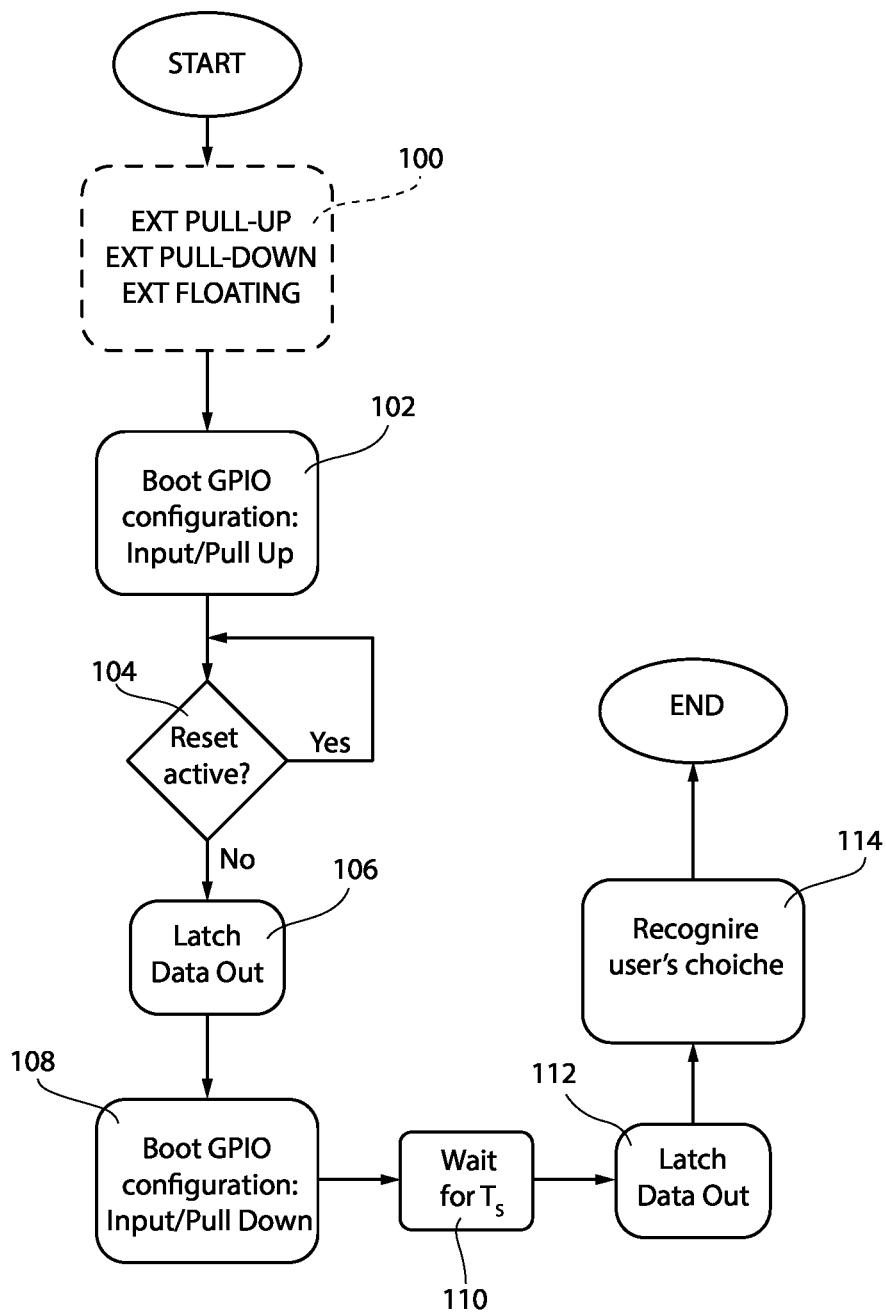
FIG. 4 is a flow chart illustrating a method implemented by the external controller of FIG. 3.

FIG. 4 shows a flowchart summarizing and generalizing the above three operating conditions, as carried out or implemented by the control logic 22 of the boot controller 20.

At step 100, the user activates one external configuration among pull-up, pull-down and floating (this step is carried out by the user manually and is not part of the operations executed by the boot controller 20). Of course, the external configuration may be selected automatically, without the manual control of the user (e.g., in case of automatized system where boot options are controlled automatically through a software).

The user also provides to the MCU 1 the reset command RST, through the reset pin $D_R$ (also this step can be executed automatically via software, according to the application).

In one embodiment, which does not limit the embodiments, the reset command RST is provided by pressing a button by the user.

In a further non-limiting embodiment, the reset command is, for example, generated by a host unit belonging to the same system (e.g., another MCU on the same board), which may also control pull-up/pull-down and potentially other interfaces of the MCU 1.

In a still further non-limiting embodiment, the reset command is, for example, forced by circuits internal to the MCU 1. This embodiment may apply, for example, when, in an initial working condition, the MCU is not supplied ($V_{DD}$ is turned-off). The reset command RST is not driven by the user and the related reset pin is left "open" or otherwise not supplied. As soon as the voltage $V_{DD}$ is switched-on, the reset command RST is forced or provided by a Power-on Reset (POR) circuit embedded in the MCU 1, until the supply voltage $V_{DD}$ reaches the working value (i.e. above a minimum operating voltage value).

It is noted that the actual timing of generation of reset signal RST and activation of the external configuration (by the user or automatically) may vary, that is to say that they may be contextual or one be provided before the other, according to requirements and configurations of the boot controller 20.

The reset command RST triggers the generations of the signals $S_{up}$ and $S_{dn}$ by the control logic 22 of the boot controller 20. In particular, in this example, at step 102 the control logic 22 generates signals $S_{up}$ and $S_{dn}$ to implement an internal pull-configuration (closing switch S1 through signal $S_{up}$ and opening switch S2 through signal $S_{dn}$).

At step 104, the boot controller 20 waits until the reset command RST is released. In another embodiment, release of the reset button is not required (e.g., the button is automatically released after a predefined time period). Other possible configurations are possible, as apparent to those skilled in the art.

At step 106, a first digital signal "1" or "0" is acquired by the input amplifier AMP_in, as already detailed above, and provided to the control logic 22 of the boot controller 20.

At step 108, the boot controller 20 generates the signals $S_{up}$ and $S_{dn}$ to implement an internal pull-down configuration (closing switch S2 through signal $S_{dn}$ and opening switch S1 through signal $S_{up}$).

With reference to step 110, after switching between internal pull-up and pull-down (or vice versa), it is advised to wait for a time interval $T_S$ to allow for stabilization of the electrical signals (e.g., $T_S$ is of few microseconds). Step 110 is optional.

At step 112, a second digital signal "1" or "0" is acquired by the input amplifier AMP_in, as already detailed above, and provided to the control logic 22 of the boot controller 20.

At step 114, the control logic 22 compares the input signals (digital values) received at steps 106 and 112 with predefined digital values (e.g., stored in the internal memory), thus recognizing the desired user's command. Accordingly, the control logic 22 can select or implement a corresponding boot mode.

For example, the internal memory can store a table as follows:

| Digital values received | Command |
|---|---|
| 00 | Activate first boot mode |
| 11 | Activate second boot mode |
| 10 | Activate third boot mode |

Accordingly, different boot options, each one corresponding to a respective couple of digital values received, can therefore be implemented. The boot options actually implemented depend on the application, and do not limit the present invention.

Figure 5:
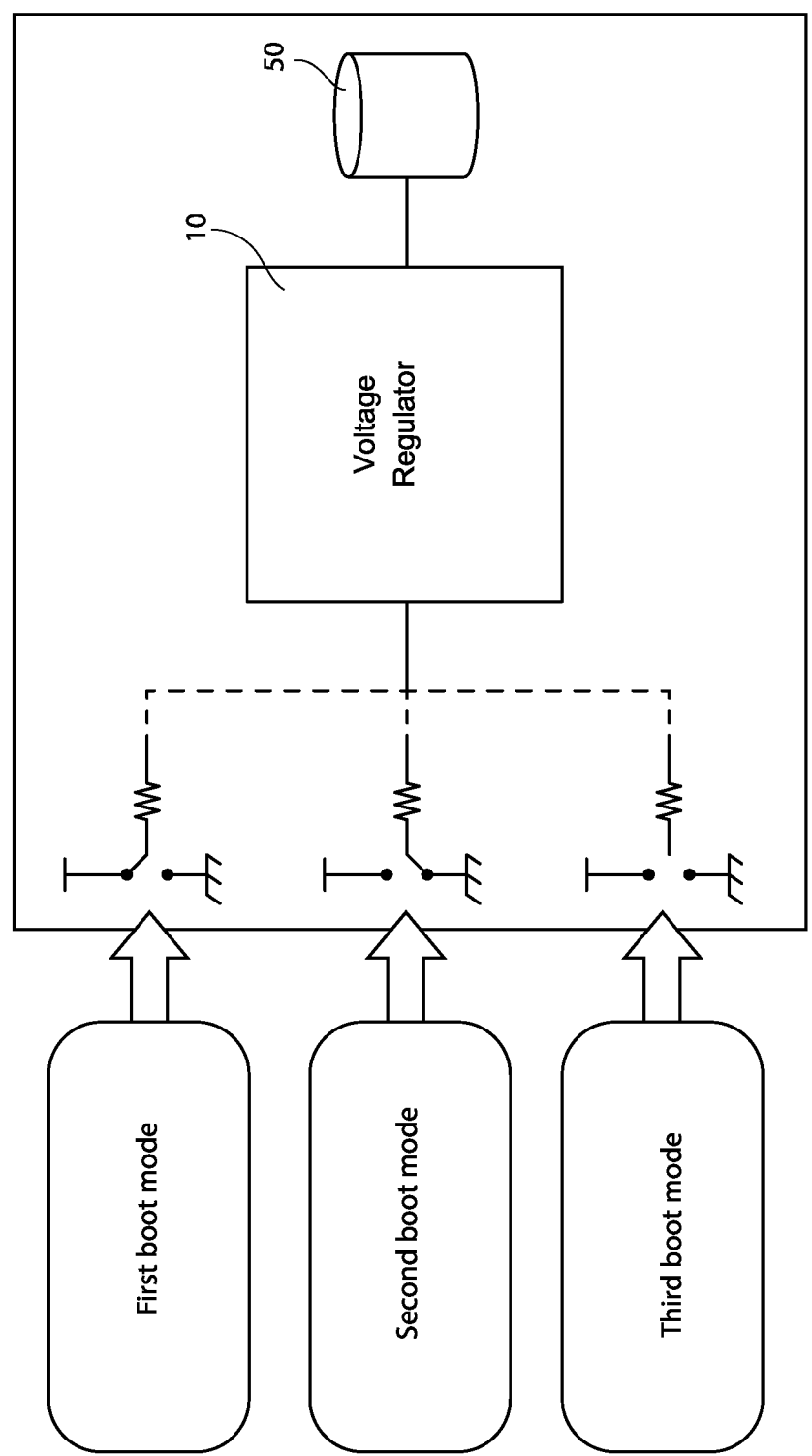
FIG. 5 represents an application of the system of FIG. 3.

FIG. 5 depicts, schematically, a possible use of the embodiments.

In FIG. 5, an MCU 1 is used, coupled to an external memory 50.

In some applications, there may be the need for executing the boot from the external memory 50. In this case, firmware must be firstly downloaded into the external memory.

A number of different external memories 50 (in particular, commercial NOR Flash memories) can be connected to the MCU 1. Each external memory 50 may work with its own internal voltage. For example, one external memory 50 may support 1.8V and another external memory 50 may support 3V. The user is free to choose the memory to work with.

To supply signals at the correct voltages to the external memory, the MCU 1 comprises an embedded voltage regulator 10, whose output voltage can be programmed (i.e. varied) by software. In order not to damage the external memory 50, care must be taken not to access the external memory 50 with a voltage level higher than that supported by such memory 50.

According to an aspect, in a first boot mode the voltage regulator starts with a voltage equal to the lowest voltage supported (in the above example, 1.8 V). Firmware is written into the external memory 50 at 1.8V.

In a second boot mode, the user can actively select a higher voltage (in the example above, 3V) supported by the external memory 50 actually used.

In a third boot mode, no firmware download into the memory 50 is required.

The above first, second and third boot modes can be selected by the user through a single input pin of the MCU 1, by assigning to each one of the external pull-up, pull-down and floating configurations a corresponding first, second and third boot mode.

The advantages of the invention described previously, according to the various embodiments, emerge clearly from the foregoing description.

In particular, reduced number of boot pins and corresponding available of more GPIOs is a highly desired competitive advantage.

Finally, it is clear that modifications and variations may be made to what has been described and illustrated herein, without thereby departing from the scope of the present invention, as defined in the annexed claims.

The invention claimed is:

1. A system, comprising:
  a micro-controller unit (MCU) including an input pin operable as a general purpose input/output interface of the MCU, an internal pull-up circuit coupled to the input pin and an internal pull-down circuit coupled to the input pin;
  an external pull-up circuit selectively coupled to the input pin;
  an external pull-down circuit selectively coupled to the input pin;
  wherein in a first configuration mode the external pull-up circuit and external pull-down circuit are decoupled from the input pin and the input pin is in a floating state;
  a control logic operatively coupled to the MCU and programmed to:
    configure the MCU according to one internal input mode between: an internal pull-up mode by coupling the internal pull-up circuit to the input pin to provide a first internal voltage logic value to the input pin, and an internal pull-down mode by coupling the internal pull-down circuit to the input pin to provide a second internal voltage logic value to the input pin;
    acquire a first input voltage signal from the input pin having, during said first configuration mode, one of the first and second internal voltage logic values according to the internal input mode in which the MCU is configured;
    further configure the MCU according to another internal input mode between the internal pull-up mode and the internal pull-down mode;
    acquire a second input voltage signal from the input pin having, during said first configuration mode, another one of the first and second internal voltage logic values according to another internal input mode in which the MCU is further configured; and
    select an operating mode of the MCU based on said first and second input voltage signals.

2. The system according to claim 1, wherein:
  in a second configuration mode, the external pull-up circuitry is configured to supply a first external voltage logic value to the input pin so that the first input voltage signal has the first external voltage logic value and the second input voltage signal has the first external voltage logic value; and
  in a third configuration mode, the external pull-down circuitry is configured to supply a second external voltage logic value to the input pin so that the first input voltage signal has the second external voltage logic value and the second input voltage signal has the second external voltage logic value.

3. The system according to claim 2, wherein the internal pull-up circuit, the internal pull-down circuit, the external pull-up circuit and the external pull-down circuit are configured so that, in the second and third configuration modes, the first and the second external voltage logic values prevail over the first and the second internal voltage logic values.

4. The system according to claim 2, wherein said first and second input voltage signals are binary signals, which vary between low and high signal levels, and wherein:
  the control logic is configured to select the operating mode of the MCU in response to a comparison of said first and second input voltage signals with expected values in the first, second and third configuration mode.

5. The system according to claim 4, wherein the internal pull-up circuit, the internal pull-down circuit, the external pull-up circuit and the external pull-down circuit are configured so that, in the second and third configuration modes, the first and the second external voltage logic values prevail over the first and the second internal voltage logic values.

6. The system according to claim 2, wherein the external pull-up circuit comprises an external resistor coupled to a biasing terminal through a first external switch; and wherein the external pull-down circuit comprises the external resistor coupled to a reference terminal through a second external switch.

7. The system of claim 6, wherein:
in the first configuration mode, both the first and the second external switches are open to decouple the input pin from both the biasing terminal and the reference terminal;
in the second configuration mode, the first external switch is closed and the second external switch is open to connect the biasing terminal to the input pin through the external resistor; and
in the third configuration mode, the second external switch is closed and the second external switch is open to connect the reference terminal to the input pin through the external resistor.

8. The system according to claim 1, further comprising a reset pin, wherein the control logic is coupled to the reset pin and configured to receive a reset signal; and
wherein the control logic acquires the first input voltage signal at the input pin in response to said reset signal.

9. The system according to claim 1, wherein the control logic is further programmed to acquire the second input voltage signal after expiration of a timer.

10. The system according to claim 1, wherein said internal pull-up circuit includes a pull-up resistor and a first internal switch coupled in series between the input pin and a biasing terminal; and wherein said internal pull-down circuitry includes a pull-down resistor and a second internal switch coupled in series between the input pin and a reference terminal; and
wherein the control logic is further configured to close the first internal switch to connect the biasing terminal to the input pin through the pull-up resistor in order to configure the MCU according to the internal pull-up mode; and close the second internal switch to connect the reference terminal to the input pin through the pull-down resistor in order to configure the MCU according to the internal pull-down mode.

11. The system according to claim 1, wherein the operating mode of the MCU selected based on said first and second input voltage signals acquired comprises one of a plurality of boot modes.

12. A method for selecting an operating mode of a micro-controller unit (MCU) that includes an input pin operable as a general purpose input/output interface of the MCU, an internal pull-up circuit coupled to the input pin and an internal pull-down circuit coupled to the input pin, comprising the steps of:
implementing an external configuration of the input pin including a first configuration mode where the input pin is configured in a floating state by decoupling the input pin from both an external pull-up circuit and an external pull-down circuit;
configuring the MCU according to one internal input mode between: an internal pull-up mode by coupling the internal pull-up circuit to the input pin to provide a first internal voltage logic value to the input pin, and an internal pull-down mode by coupling the internal pull-down circuit to the input pin to provide a second internal voltage logic value to the input pin;
acquiring a first input voltage signal at the input pin that has, during said first configuration mode, one between the first and second internal voltage logic values according to the internal input mode in which the MCU is configured;
further configuring the MCU according to another internal input mode between the internal pull-up mode and the internal pull-down mode;
acquiring a second input voltage signal at the input pin that has, during said first configuration mode, the other one between the first and second internal voltage logic values according to another internal input mode in which the MCU is further configured;
selecting said operating mode of the MCU based on said first and second input voltage signals.

13. The method according to claim 12, further comprising the step of implementing further external configurations of the input pin including at least one among:
a second configuration mode in which a first external voltage logic value is supplied to the input pin by the external pull-up circuitry so that the first input voltage signal has the first external voltage logic value and the second input voltage signal has the first external voltage logic value; and
a third configuration mode in which a second external voltage logic value is supplied to the input pin by the external pull-down circuitry so that the first input voltage signal has the second external voltage logic value and the second input voltage signal has the second external voltage logic value.

14. The method according to claim 13, wherein the internal pull-up circuit and the internal pull-down circuit and the external pull-up circuit and the external pull-down circuit are configured so that, in the second and third configuration modes, the first and the second external voltage logic values prevail over the first and the second internal voltage logic values.

15. The method according to claim 13, wherein said first and second input voltage signals are binary signals, which vary between low and high signal levels;
wherein the step of selecting the operating mode of the MCU includes comparing said first and second input voltage signals with expected values in the first, second and third configuration mode, and selecting the operating mode of the MCU based on a result of said comparison.

16. The method according to claim 15, wherein the internal pull-up circuit, the internal pull-down circuit, the external pull-up circuit and the external pull-down circuit are configured so that, in the second and third configuration modes, the first and the second external voltage logic values prevail over the first and the second internal voltage logic values.

17. The method according to claim 13, wherein the external pull-up circuitry is formed by an external resistor coupled to a biasing terminal through a first external switch; and wherein the external pull-down circuitry is formed by the external resistor coupled to a reference terminal through a second external switch.

18. The method according to claim 17, wherein:
the step of implementing the first configuration mode comprises opening both the first and the second external switches, thus decoupling the input pin from both the biasing terminal and the reference terminal;
the step of implementing the second configuration mode comprises closing the first external switch and opening the second external switch, thus connecting the biasing terminal to the input pin through the external resistor; and
the step of implementing the third configuration mode comprises closing the second external switch and opening the second external switch, thus connecting the reference terminal to the input pin through the external resistor.

19. The method according to claim 12, further comprising the steps of:
   acquiring a reset signal from a reset pin; and
   performing the step of acquiring the first input voltage signal at the input pin in response to said reset signal.

20. The method according to claim 12, further comprising performing the step of acquiring the second input voltage signal in response to expiration of a timer.

21. The method according to claim 12, wherein said internal pull-up circuit includes a pull-up resistor and a first internal switch coupled in series between the input pin and a biasing terminal; and wherein said internal pull-down circuit includes a pull-down resistor and a second internal switch coupled in series between the input pin and a reference terminal;
   wherein the step of configuring the MCU according to the internal pull-up mode comprises closing the first internal switch to connect the biasing terminal to the input pin through the pull-up resistor; and
   wherein the step of configuring the MCU according to the internal pull-down mode comprises closing the second internal switch to connect the reference terminal to the input pin through the pull-down resistor.

22. The method according to claim 12, wherein the step of selecting the operating mode of the MCU includes selecting one of a plurality of boot modes.

\* \* \* \* \*